United States Patent [19]
Auger

[11] Patent Number: 6,030,692
[45] Date of Patent: *Feb. 29, 2000

[54] COVER TAPE FOR FORMED TAPE PACKING SYSTEM AND PROCESS FOR MAKING SAME

[75] Inventor: Thomas J. Auger, Putnam, Conn.

[73] Assignee: Netpco Incorporated, Pawtucket, R.I.

[*] Notice: This patent issued on a continued prosecution application filed under 37 CFR 1.53(d), and is subject to the twenty year patent term provisions of 35 U.S.C. 154(a)(2).

[21] Appl. No.: 08/713,504

[22] Filed: Sep. 13, 1996

[51] Int. Cl.[7] .................................................. C09J 7/02
[52] U.S. Cl. ........................ 428/200; 427/208.2; 428/344; 428/349; 428/353; 428/354
[58] Field of Search .................................... 428/354, 344, 428/353, 922, 200, 349; 427/208.2

[56] References Cited

U.S. PATENT DOCUMENTS

| | | | |
|---|---|---|---|
| 4,929,486 | 5/1990 | Itou | 428/354 |
| 4,966,282 | 10/1990 | Kawanishi et al. | 206/330 |
| 5,025,923 | 6/1991 | Okui | 206/329 |
| 5,208,103 | 5/1993 | Miyamoto | 428/354 |
| 5,343,363 | 8/1994 | Greeson et al. | 361/749 |
| 5,346,765 | 9/1994 | Maeda | 428/354 |
| 5,441,809 | 8/1995 | Akhter | 428/354 |
| 5,447,784 | 9/1995 | Williams | 428/354 |
| 5,491,013 | 2/1996 | Holley | 428/354 |
| 5,524,765 | 6/1996 | Gutentag | 206/713 |
| 5,637,368 | 6/1997 | Cadalbert | 428/354 |
| 5,691,038 | 11/1997 | Hirata | 428/354 |

FOREIGN PATENT DOCUMENTS 350 003 A2 1/1990 European Pat. Off. .

*Primary Examiner*—Jenna Davis
*Attorney, Agent, or Firm*—Mintz, Levin, Cohn, Ferris, Glovsky and Popeo, P.C.

[57] ABSTRACT

A device comprising a carrier tape with compartments and a cover tape for sealing items in the compartments includes a cover tape having a base film layer, a striped adhesive layer formed on the first surface of the base film to adhere the cover tape to the carrier tape, and an antistatic layer formed on the adhesive layer and base film layer to provide antistatic coating on substantially the entire width of the surface of the base film. A primer layer containing an antistatic agent may be placed on the base film layer as an alternative to an antistatic layer.

30 Claims, 10 Drawing Sheets

COVER TAPE FOR FORMED TAPE PACKING SYSTEM AND PROCESS FOR MAKING SAME

FIELD OF THE INVENTION

The present invention relates to a cover tape for sealing compartments of a formed carrier tape, which is used for packaging items, such as small electronic and mechanical parts.

BACKGROUND OF THE INVENTION

In recent years, chip-type electronic parts used for surface mounting, such as IC's, transistors, diodes, condensers, piezoelectric resistors and the like have been supplied by being contained in packaging materials consisting of a plastic carrier tape having at given intervals pockets formed by embossing so as to accommodate chip-type electronic parts of particular shape and a cover tape heat sealable to the carrier tape. The electronic parts contained in the packaging materials are automatically taken out after peeling the cover tape of the package and are mounted on the surface of an electronic circuit substrate.

In use, the carrier tape and cover tape are stored on separate roles or reels. The carrier tape is unwound from its storage reel and extended in a linear fashion, such that parts can be inserted into its cavities. As the parts are inserted, the cover tape is applied along the linear length of the carrier tape, such that an adhesive coated side of the cover tape comes into contact with the carrier tape. The cover tape and carrier tape are in contact with one another at their linear edges, and the adhesive on the cover tape is activated (rendered tacky) by the application of heat or pressure at those points in which it is in contact with the carrier tape. The heat is provided in a sufficient amount, balanced with an appropriate amount of pressure and dwell time, to activate the adhesive, such that a bond of uniform strength is obtained across the length of the tape. The heat and pressure can be applied by any one of a number of different techniques, e.g. hot air guns, drag shoes, ultrasonics, reciprocating sealing shoes, heated pinch rollers, etc. In several prior art devices, the adhesive carried on the cover tape that is not subjected to the heat and pressure is not activated, and as such, it remains non-tacky.

With the significant improvement in surface mounting techniques in recent years, electronic parts to be surfaced-mounted have come to be made in chips of higher capability and smaller size. In such a movement, the electronic parts, when transferred in a package have undergone vibration and contact with the embossed inner surface of the carrier tape of the package, or the inner surface of the carrier tape of the package, and the resulting friction generates static electricity. Static electricity has also been generated when the cover tape is peeled off from the carrier tape; this static electricity has generated sparks to cause destruction and deterioration of electronic parts. Thus, the electronic parts have had troubles due to static electricity, and it has been an important task to develop an anti-static measure for packaging materials, such as carrier tape and cover tape.

The anti-static treatment for a carrier tape has before been effected by incorporation or coating of carbon black into or on the carrier tape used, and the effect has been satisfactory. For the anti-static treatment of the cover tape, the coating of an anti-static agent or conductive material on the outer layer of the cover tape has been utilized. This treatment, however, has not been sufficient for the protection of electronic parts to be contained by sealing because the treatment is applied to the outer side of the cover tape, and particularly the treatment was ineffective for the static-electricity generated by the contact of the inner surface of the cover tape with the electronic parts. The anti-static treatment for the inner surface of the cover tape, i.e. the adhesion layer of the cover tape can be effected by coating or incorporation of an anti-static agent on or into the adhesion layer. In this approach, however, the anti-static agent incorporated into the adhesion layer has bled onto the inner surface of the cover tape and invited unstable sealing and many troubles due to poor sealing. Further, the anti-static effect has decreased with the lapse of time and has been greatly affected by the conditions under which the package was used, such as temperature and humidity, and has significantly decreased under a low humidity, such as 10 percent R.H. (relative humidity). Therefore, no sufficient effect has been obtained.

The incorporation of a conductive material into the adhesion layer has been technically difficult as well. This is because the adhesion layer has been formed by laminating a film or the like to an outer layer, and the incorporation has significantly reduced the transparency of the resulting cover tape, making the cover tape usability questionable. The coating of a conductive material on the adhesion layer has not been effected, because the selection of a binder that may stably bond to the carrier tape has been difficult and because the adhesion layer is covered and hidden by the coating.

An additional problem with respect to items enclosed by cover tapes in packaging systems is machine readability of the item. As industry has become more automated, light sensors have increasingly been used to identify orientation, quality, and quantity of products which are sealed in a carrier tape packaging system. The light sensors require a transparent cover tape in order to function properly. This transparency and hence, machine readability, can be significantly affected by adhesive materials on the cover tape.

Several prior art methods have been used to attempt to solve these problems. For example, U.S. Pat. No. 5,064,064 and sister U.S. Pat. Nos. 4,994,300 and 4,929,486, each issued to Itou et al. and disclose a device for packing chips with a cover tape for the same. The cover tape disclosed includes a base tape, an adhesive layer formed on only one surface of a base tape, and a non-adhesive layer with an anti-static agent, which is pattern-printed on the adhesive layer centrally along the longitudinal direction of the base tape. The anti-static properties of this tape are only located over the chip materials. Furthermore, the tape disclosed does not provide a clear package in which to view the chip or part located in the carrier tape beneath the cover tape. Similarly, U.S. Pat. No. 5,208,103 issued to Miyamoto et al. and U.S. Pat. No. 5,346,765 issued to Maeda et al. are each directed towards cover tapes for packaging chip-type electronic parts. Each of these patents utilizes a biaxially oriented film with an adhesion layer of a dispersion of conductive fine powders. These patents still require an adhesive layer across the entire carrier tape surface, therefore allowing the chip contained in the pocket below the cover tape to contact the adhesive.

SUMMARY OF THE INVENTION

The present invention provides a cover tape for sealing compartments of a carrier tape, which is used for packing items, such as small electronic, mechanical or pharmaceutical parts that are arranged longitudinally in the carrier tape and in a spaced apart relation with the purpose of storage, transportation and the automatic dispersal thereof. The invention also relates to a process for the preparation of such a cover tape. The flexible cover tape of the present invention provides an anti-static coating on substantially the entire width of the cover tape film, yet allows for the adhesive of the cover tape to contact the edge area of the carrier tape without contacting the chip or part contained in the pocket region of the carrier tape. The cover tape of the present invention further provides a central region with improved clarity and transparency so as to enable one to view the individual parts or products contained in the individual pockets formed by the interaction of the cover tape and the carrier tape. Likewise, this feature improves the machine readability of the cover tape to inspect the parts in the compartments. Machine readability plays an important role in industry today, as machines with light sensitive detectors are used to make sure that items are in the holders and properly aligned therein. This readability, therefore, prefers a transparent cover tape.

The present invention discloses a device which comprises a carrier tape having item-holding compartments provided intermittently and longitudinally of the carrier tape and a cover tape on the carrier tape for sealing items in the holding compartments. The cover tape includes a base film layer having first and second surfaces and a width. There is a striped adhesive layer formed on the first surface of the base film layer and a first anti-static layer is formed on the adhesive layer and on the base film layer to thereby provide an anti-static coating on substantially the entire width of the first surface of the base film as the adhesive layer adheres the cover tape to the carrier tape and covers the items in the holding compartments of the carrier tape. A second anti-static layer is formed on the second surface of the base film layer. The base film layer may be further defined to include a pair of edge areas located on the first surface of the base film layer with the edge areas defining a central area. The striped adhesive layer is formed on the edge areas of the base film layer so as to define a product viewing area. The visibility, clarity, and light transmission of the product viewing area, is, therefore, no worse than the visibility, clarity, and light transmission of the base film layer. Preferably, the adjacent adhesive stripes are spaced apart at a distance of at least the width of the carrier tape compartments. A primer layer may be coated on the first surface of the base film layer with the striped adhesive layer then disposed on the primer layer.

In a second embodiment of the present invention, the device comprises a carrier tape with holding compartments provided intermittently and longitudinally on the carrier tape and a cover tape for sealing items in the holding parts or compartments of the carrier tape. The cover tape in this embodiment includes a base film layer with first and second surfaces, and a primer layer containing an anti-static agent coated on the first surface of the base film layer. The second embodiment can also include an anti-static layer formed on the second surface of the base film layer. The base film layer again includes the pair of edge areas and a central area with the striped adhesive formed on the edge areas.

In a third embodiment of the present invention, the device comprises a plurality of laterally spaced and separated compartments located side by side on a single carrier tape. The carrier tape in this embodiment has a pair of edges and at least one bridge which extends longitudinally the length of the carrier tape to divide the tape into product columns. The cover tape in this embodiment includes the features of the first two embodiments and additionally, the striped adhesive layer comprises a plurality of adhesive stripes which define a plurality of product viewing areas. Preferably, the adhesive stripes are spaced apart at a distance of at least the width of the carrier tape compartments. The plurality of adhesive stripes includes a pair of edge stripes positioned on the edge areas of the base film and at least one bridge stripe positioned on the central area of the base film. The adhesive bridge stripes and edge stripes align with the respective edge areas and bridge of the carrier tape to seal the product in the compartments of the carrier tape.

A process for forming the cover tape is also provided. The process includes providing a base film layer with first and second surfaces and a width, applying a striped adhesive on the first surface of the base film, and forming a first anti-static layer on the adhesive layer thereby providing an anti-static coating on substantially the entire width of the first surface of the base film. The process can also have a second embodiment where a primer layer with an anti-static agent is applied on the base film layer on the first surface to provide an anti-static coating on substantially the entire width of the base film. A striped adhesive layer is then applied on the primer layer. In each of these embodiments for the process, a second anti-static layer may be applied on the second surface of the base film layer.

In use, the adhesive layer on the edges of the cover tape is heat or pressure sealed to the carrier tape after chips or items are placed in the individual compartments of the carrier tape. The adhesive layer, cover tape, and carrier tape cooperate to form individual pockets and protect the chips from debris and static. The adhesive stripes form a product viewing area and in a preferred embodiment, the location of the adhesive layer solely on the edge areas of the cover tape avoids any contact with the chip stored in the compartments, since the adhesive only contacts the edge area of the carrier tape and the distance between the adjacent adhesive stripes is wider than the width of the individual chip compartments of the carrier tape. Furthermore, the location of the adhesive stripes improves the transparent qualities of the cover tape to allow for greater visibility and machine readability of the product beneath the film. When the cover tape is removed from the carrier tape, the location of the adhesive on the edge areas significantly reduces or eliminates the possibility of static discharge to the chip or part.

BRIEF DESCRIPTION OF THE DRAWINGS

The invention will now be described in detail with reference to the attached drawings in which.

DETAILED DESCRIPTION OF THE INVENTION

Figure 1:
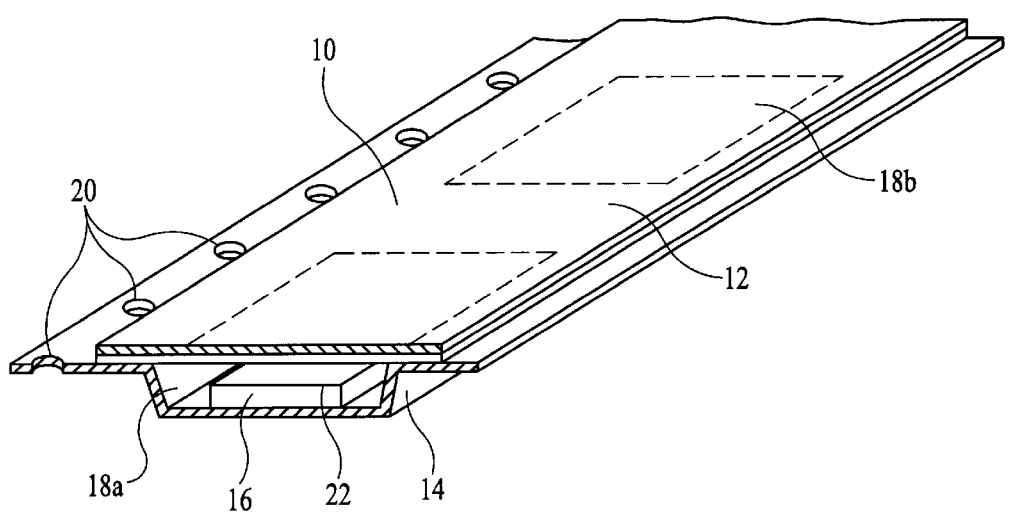
FIG. 1 is a partial cross-sectional perspective view of a cover tape and carrier tape device according to the present invention.

As shown in FIG. 1, a cover tape and carrier tape device of the present invention 10 is shown generally. The device 10 comprises a carrier tape 14 having a plurality of holding compartments 18a and 18b each with a width and provided intermittently and longitudinally on the carrier tape. A transparent and flexible cover tape 12 is heat sealed or pressure sealed onto the carrier tape 14 for sealing items or chips 16 in the holding parts 18a and 18b. The design of the cover tape 12 allows for improved clarity in viewing the chips or parts located in the chip holding compartments 18a and 18b and also allows for improved anti-static properties without any adhesive material of the cover tape 12 contacting the surface 22 of the chip 16.

Figure 2:
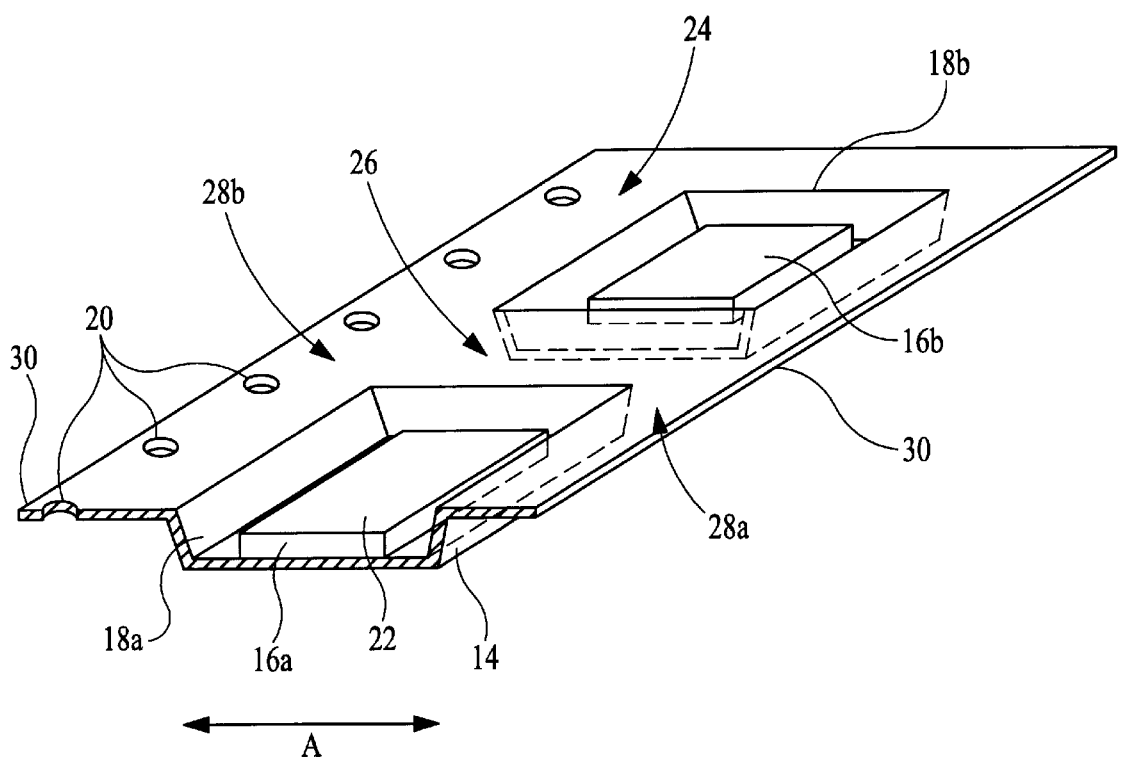
FIG. 2 is a partial cross-sectional perspective view of the carrier tape with an item or part located in the compartments.

As shown in FIG. 2, a carrier tape 14 for use in the present invention is disclosed. The carrier tape 14 is a punched or pocketed carrier tape which can be made from a variety of materials, including, but not limited to plastic, paper, or metal substrates. Carrier tapes 14 of the present invention generally have at least one row of chip or item holding compartments 18a and 18b extending intermittently and longitudinally on the carrier tape 14. These chip and part holding compartments 18a and 18b are typically of a predetermined dimension for each carrier tape 14. The apertures 18a and 18b are submerged beneath the surface 24 of the carrier tape 14 and separated by divider 26. The compartments 18a and 18b are of a predetermined width A, which thereby creates a pair of oppositely disposed edge areas 28a and 28b on opposite sides of the compartments. A row of holes 20 are provided along at least one of the edge areas 28 of the carrier tape 14 for a delivery purpose, such as for engagement with a gear or sprocket on the machines. Items 16a and 16b may be placed in the compartments 18a and 18b with a top surface 22 of the chip or part 16 located below the level of the carrier tape surface 24. Without intending any limitation, one example of a carrier tape provides dimensions of a tape which is approximately 24 millimeters wide from the edge 30a to edge 30b. The compartments 18a and 18b in one known embodiment, have a width of approximately 12 millimeters, which corresponds to width A on FIG. 2 and the compartment 18 has a length of approximately 1 centimeter with a depth of approximately 3 millimeters. The edge areas 28a and 28b, in this particular example, range from approximately 3 to 6 millimeters in width from the respective edges 30a and 30b to compartments 18. Several other dimensions of carrier tapes are known and available. Carrier tape materials of the present invention include, but are not limited to plastic, paper or metal substrates. Preferred materials for the present invention include polystyrene, polycarbonate, polyvinyl chloride, PET, PET-G, and paper.

Figure 3:
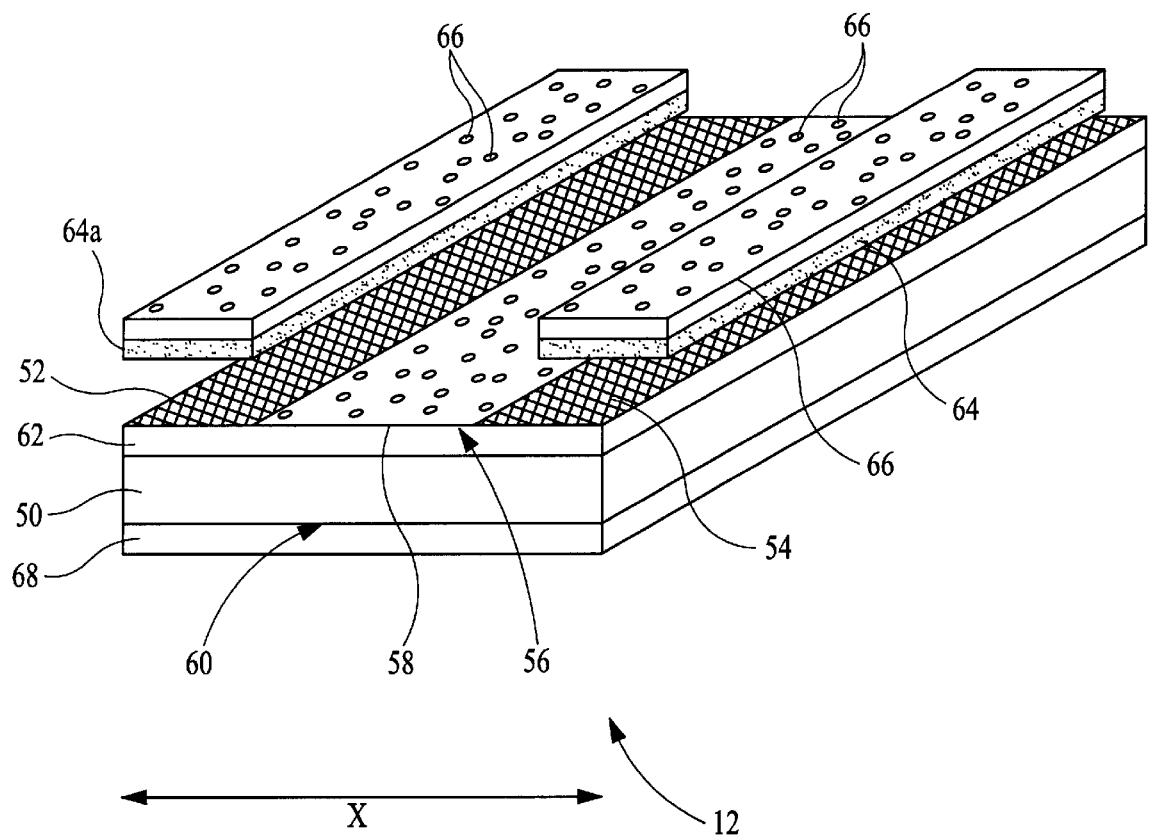
FIG. 3 is a partial cross-sectional perspective view of one embodiment of the cover tape design.

As shown in FIG. 3, the cover tape 12 according to one embodiment of the present invention is shown. The cover tape 12 includes a base film 50, a primer layer 62, an adhesive layer 64, a first anti-static coating 66, and a second anti-static coating 68.

A base film layer 50 can include a primer layer 62 and have a first surface 58 and a second surface 60. The base film 50 and cover tape 12 have a width of X. The first surface 58 has a pair of edge areas 52 and 54 which define a central product viewing area 56. The base film 50 is made of a transparent or clear plastic material, including but not limited to polyethylene terephthalate (PET), polypropylene (PP), high density polyethylene, polystyrene, polyamide, polycarbonate, nylon, polyethylene napthalate (PEN) and polyvinyl chloride. Of these films, PET is preferred. The thickness of the base tape 50 is normally from 0.00028 inches to 0.005 inches and preferably from 0.00048 to 0.00142 inches. The primer layer 62 on the base film 50 can be made of an ethyl vinyl acetate material (EVA), but no limitation is intended. The thickness of the primer layer 62 is normally from about 0.05 micrometers to about 5.0 micrometers and preferably from about 1 to about 3 micrometers. The primer layer 62 may be applied by gravure coating. Other methods for the primer include spray, offset, reverse roll, slot die, rotary screen printing/coating, and other roll coating methods.

Figure 9A:
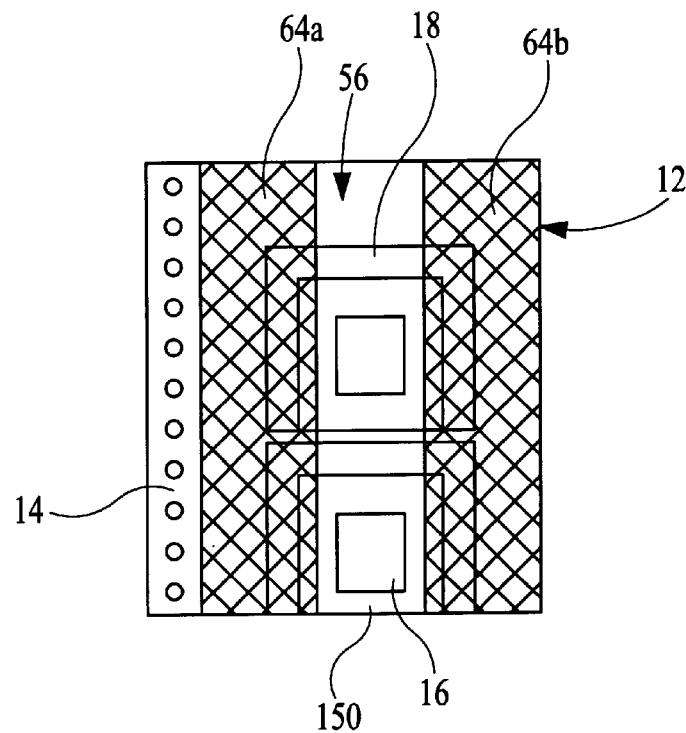
FIGS. 9A and 9B are top views of the present invention with the product positioned in a retainer mechanism.

Adhesive layer 64 is formed on the edge areas 52 and 54 of the base film 50 and primer 62. The adhesive layer 64a and 64b may be pattern printed or stripe coated onto the film rolls prior to slicing the base film to the predetermined width for the cover tape. The adhesive 64a and 64b should be pattern coated or spray coated onto the edge areas 52 and 54 and thereby leaving an area without adhesive which defines a product viewing area 56 over the compartment 18 of the carrier tape 14. Preferably, the distance between respective adhesive layers 64a and 64b is at least equal to or greater than the width A of the compartment 18 on the carrier tape 14, although shorter distances may function depending on the size, configuration, and movability of the item 16 within the compartment. (See FIG. 9A). The width of the stripe 64 may vary depending on the size of the edge area 28 of the carrier tape 14. Other coating methods for the adhesive layer include slot die, reverse roll, knife over roll, Meyer rod, rotary screen printing/coating, gravure, and thermal extrusion.

The striped or pattern printed adhesive layer 64a and 64b may be a pressure-sensitive adhesive which is preferably sticky at ambient temperatures or a heat-sensitive adhesive. Pressure-sensitive adhesives which may be used to form the adhesive layer 64 can include acrylic and methacrylic adhesives and rubber-based adhesives, but no limitation is intended. Specific examples of (meth) acrylic adhesives include, for example, homo-polymers and copolymers of (meth) acrylic acid esters, such as ethyl, butyl, 2-ethyhexyl, glycidyl and 2-hydroxy ethyl acrylates and methacrylate, and copolymers of at least one of such (meth) acrylates with at least one copolymerizable such as vinyl acetate, acrylic acid, methacrylic acid, styrene and acrylonitrile. Examples of rubber-based adhesives include, for example, natural rubbers (NR), polyisobutylene rubbers (IR), butadiene rubbers (BR), styrene-butadiene rubbers (SBR) and styrene-isoprene, iso-styrene copolymer (SIS), alone or in combination, as well as blends of at least of such rubbers with at least one other tackifier such as a rosin or a terpene resin. The thickness of the striped coated or pattern printed adhesive layer is normally from about 10 to 100 micrometers, and preferably from about 15 to 60 micrometers, and most preferably about 30 micrometers.

Examples of heat sensitive adhesives which can be used with the present invention include, but are not limited to, ethylene-vinyl acetate (EVA), styrene-butadiene rubber (SBR), ionomeric rubber, polybutadiene rubber (BR), styrene-isoprene-styrene block copolymer (SRS), styrene-ethylene-butadiene-styrene block copolymer (SEBS), polyurethane polymers, thermoplastic polyesters, and polyurethane specialty blends. Blends of any of these adhesives can also be used.

The adhesive layer can include a filler material of polyolefin powder, but no limitation is intended. It would be known by one of skill in the art to select and tailor the adhesive to the particular substrate of the carrier tape. For example, an adhesive layer of SEBS copolymer has high adhesion to a carrier tape of polyethylene material.

A first anti-static coating 66 is formed on the adhesive layers 64a and 64b and on the central area 56 of the first surface 58 of the film 50. This first anti-static layer 66 provides an anti-static coating therefore, on substantially the entire width of the first surface of the base film (distance X in FIG. 3) as the adhesive layer adheres to the carrier tape in use. A second anti-static coating layer 68 is also applied to the second surface 60 of the base film 50. The anti-static agent in the coatings has a resistivity value of less than $10^{12}$ ohms per square, with a preferred resistivity of less than $10^{10}$ ohms per square.

Suitable anti-static agents of the present invention may include, but are not limited to, surfactants, quarternary amines, aliphatic sulfonates, salts of higher alcohol sulfates, salts of higher alcohol phosphates, ethylene oxide adducts to higher alcohols and polyethylene glycol esters of fatty acids. By incorporating an anti-static layer it is thus possible to prevent damage of the chips or electric parts 16 in the compartment 18 by static charge and static attraction of the chips which may cause the chips to fall off. This also prevents static charge and attraction of the chips or electric parts to the cover tape 12 upon peeling the cover tape from the carrier tape 14.

It should be noted that in this embodiment of the invention, the base film 50 may include the primer layer 62, so that the first surface 58 of the base film 50 is the primer layer 62.

Figure 4:
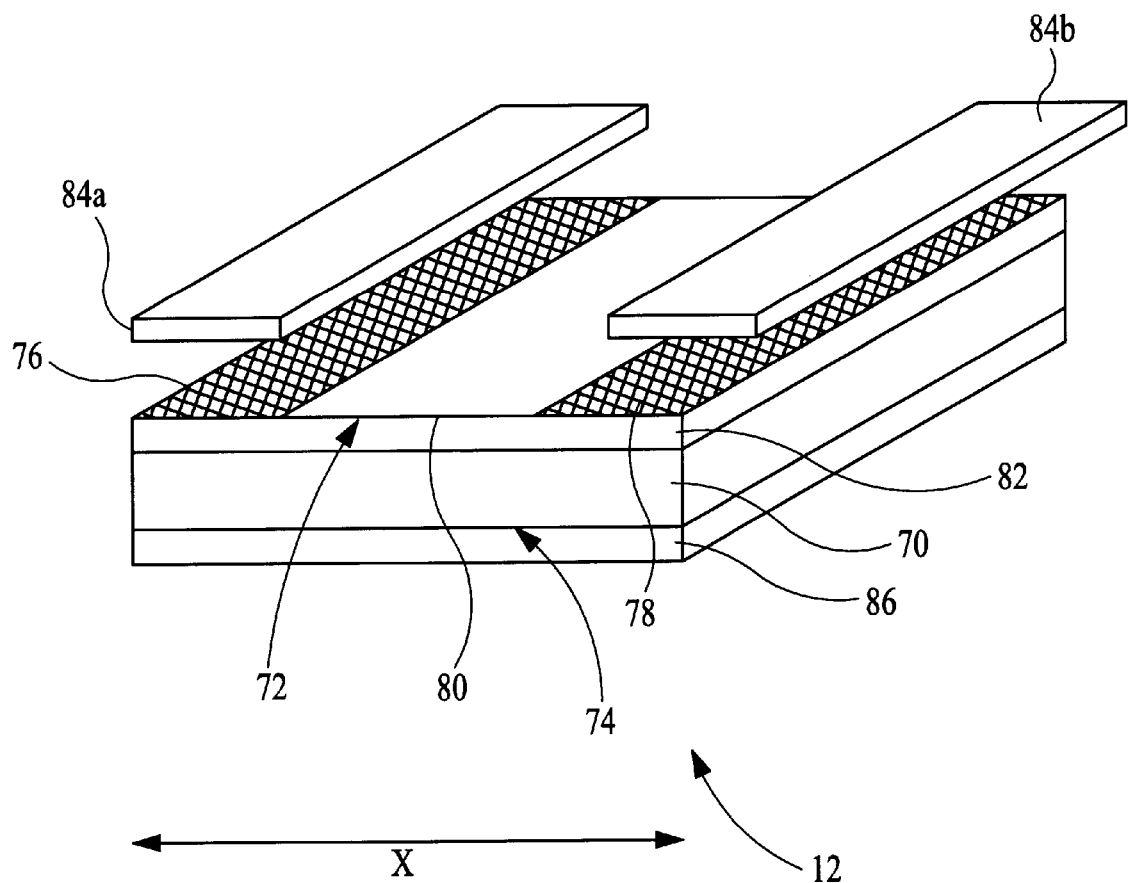
FIG. 4 is a partial cross-sectional perspective view of a second embodiment of a cover tape of the present invention.

Referring now to FIG. 4, there is shown a second embodiment of the present invention. The cover tape 12 of the second embodiment includes a base film 70 with a primer 82, an adhesive which is stripe coated or pattern printed, and an anti-static layer 86 on a second surface 74 of the base film 70.

The base film 70 again has a first surface 72 and a second surface 74 with a central product viewing area 80 and edge areas 76 and 78. The central product viewing area 80 is again defined by adjacent adhesive stripes 84a and 84b and the respective edge areas upon which the stripes are located. Preferably, the product viewing area 80 should again be at least as wide as the width A of carrier tape compartments 18, or greater, and the central area 80 is disposed approximately in the center of the base film 70 which has a width of X. The primer 82 may be formed or coated on the base film 70. In this embodiment, the primer 82 has an anti-static agent dispersed within it, thereby eliminating the need for coating the adhesive 84a and 84b with an anti-static agent afterward. Even so, the adhesive may be coated with an anti-static agent or have an anti-static agent dispersed within the adhesive. The materials used in the first embodiment along with the dimensions thereof are suitable for this embodiment as well.

Figure 5:
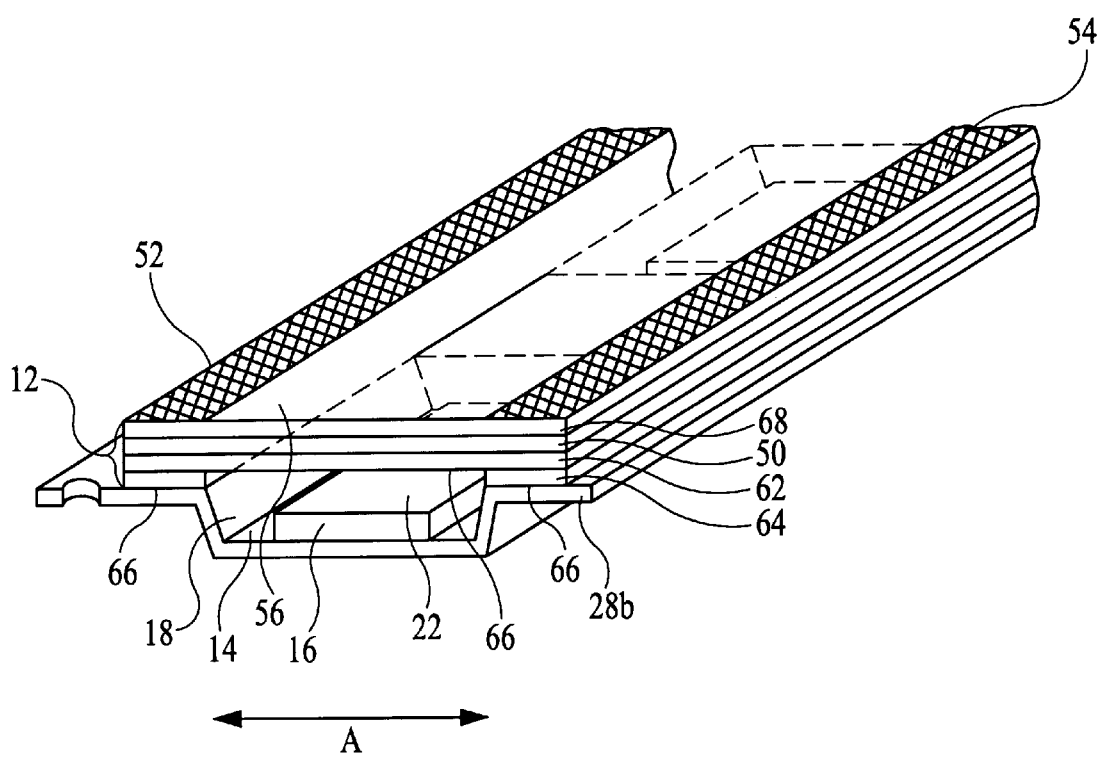
FIG. 5 is a partial cross-sectional perspective view of the cover tape and carrier tape assembly according to the present invention.

Referring now to FIG. 5, there is shown the cover tape 12 of the present invention in use on the carrier tape 14 and working in combination to form the device 10. The cover tape 12 is positioned on to the carrier tape 14 with the stripe coated or pattern printed adhesive layers aligning on edge areas 28a and 28b of the carrier tape 14. The adhesive of the cover tape 12 is then heat sealed or pressure sealed onto the carrier tape so that in this manner the cover tape 12 cooperates with the pocket 18 of the carrier tape 14 to enclose the chip or electric part 16 in a static free environment. The bonding temperature can range from 140° to 250° C. The time requirement for bonding can be from 0.1 to 2.0 sec., preferably 0.25 to 0.5 sec. It would be known by one skilled in the art to adjust pressure, bond level and time to obtain ideal results.

Since the adhesive 64a and 64b is located only along the edge areas 28a and 28b of the carrier tape 14 in a preferred embodiment, the top surface of the chip 22 is not in contact with any adhesive material and therefore avoids damage of the chip or part. This is because the adhesive layers are preferably striped or pattern printed a distance of greater than or equal to the width A of the carrier tape compartment 18, although shorter distances may be functional as well, depending upon the size, configuration, and movability of the item in the carrier tape compartment. For example, the item may be encased in a retainer mechanism 150. This would allow the adhesive stripes to be spaced closer together and extend over a portion of the compartment area where the retainer mechanism 150 is positioned without contacting or interfering with the visibility of the item. (See FIG. 9A.)

In like manner, the central product viewing area 56 of the cover tape 12 provides improved clarity and transparency so that the chip or part can be viewed easier for damage and inspection purposes. The clarity of the product viewing area 56 is, therefore, no worse than the clarity, visibility, and light transmission of the base film material, or of the base film material with the primer layer in the second embodiment. It can also be seen here that the cover tape 12 in either embodiment allows for an anti-static coating across substantially the entire width X of the carrier tape.

When the cover tape 12 is removed from the carrier tape 14 to expose the items 16 and allow access to the product, the pattern printed or striped coated adhesive layers remain on the cover tape. It is preferred to have a peel strength in the range of 10 to 110 grams.

Figure 6:
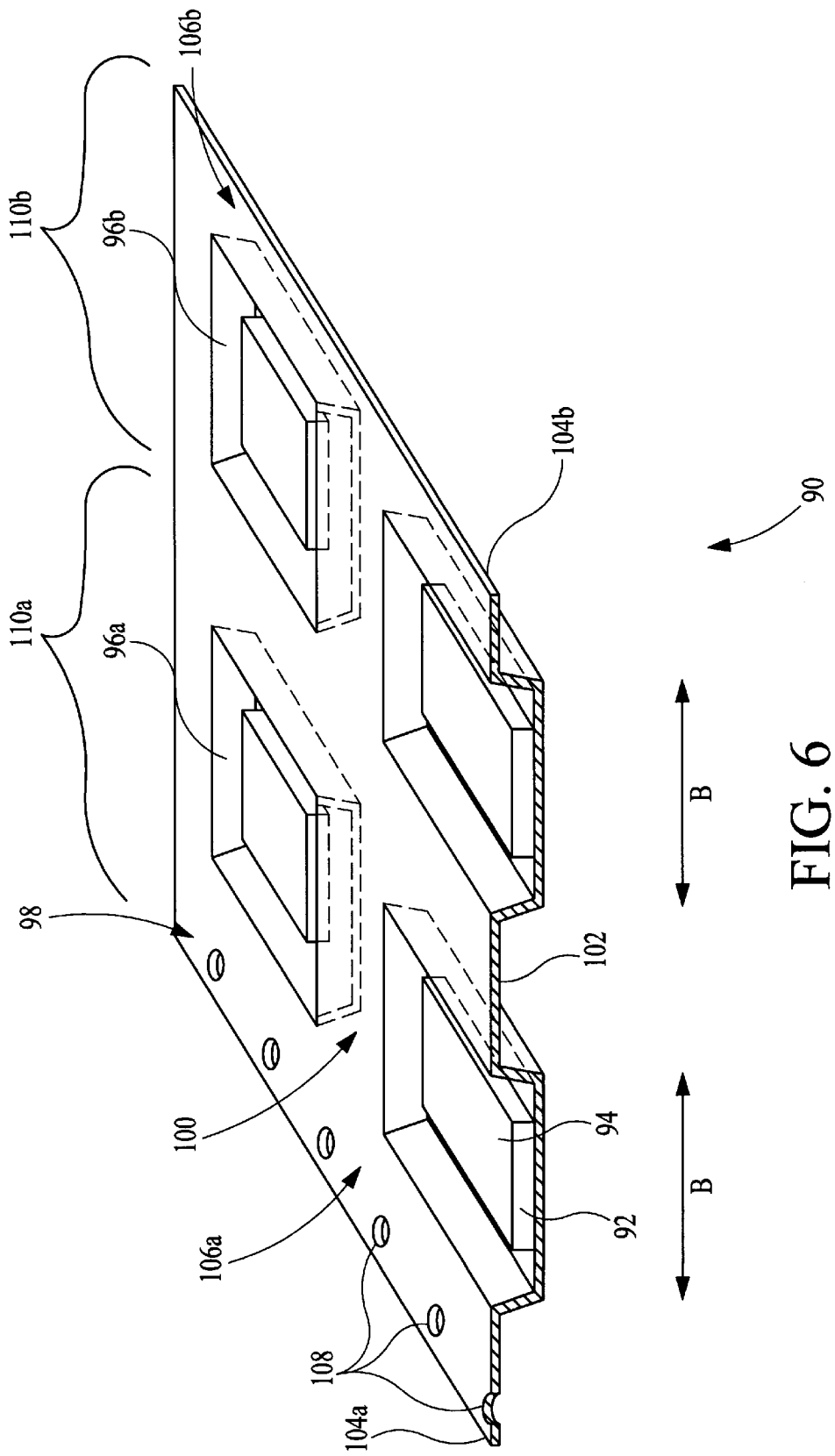
FIG. 6 is a partial cross-sectional perspective view of a carrier tape with laterally separated holding compartments.
Figure 7:
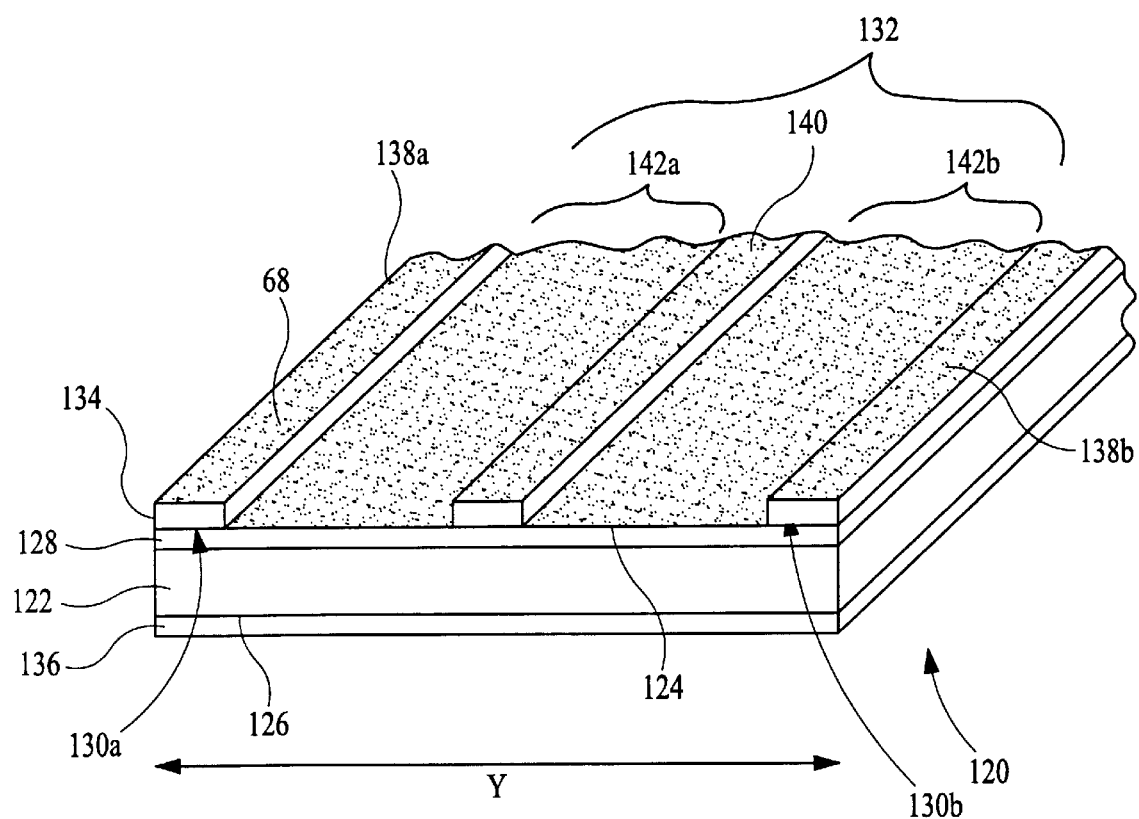
FIG. 7 is a partial cross-sectional perspective view of a third embodiment of the cover tape of the present invention.
Figure 8:
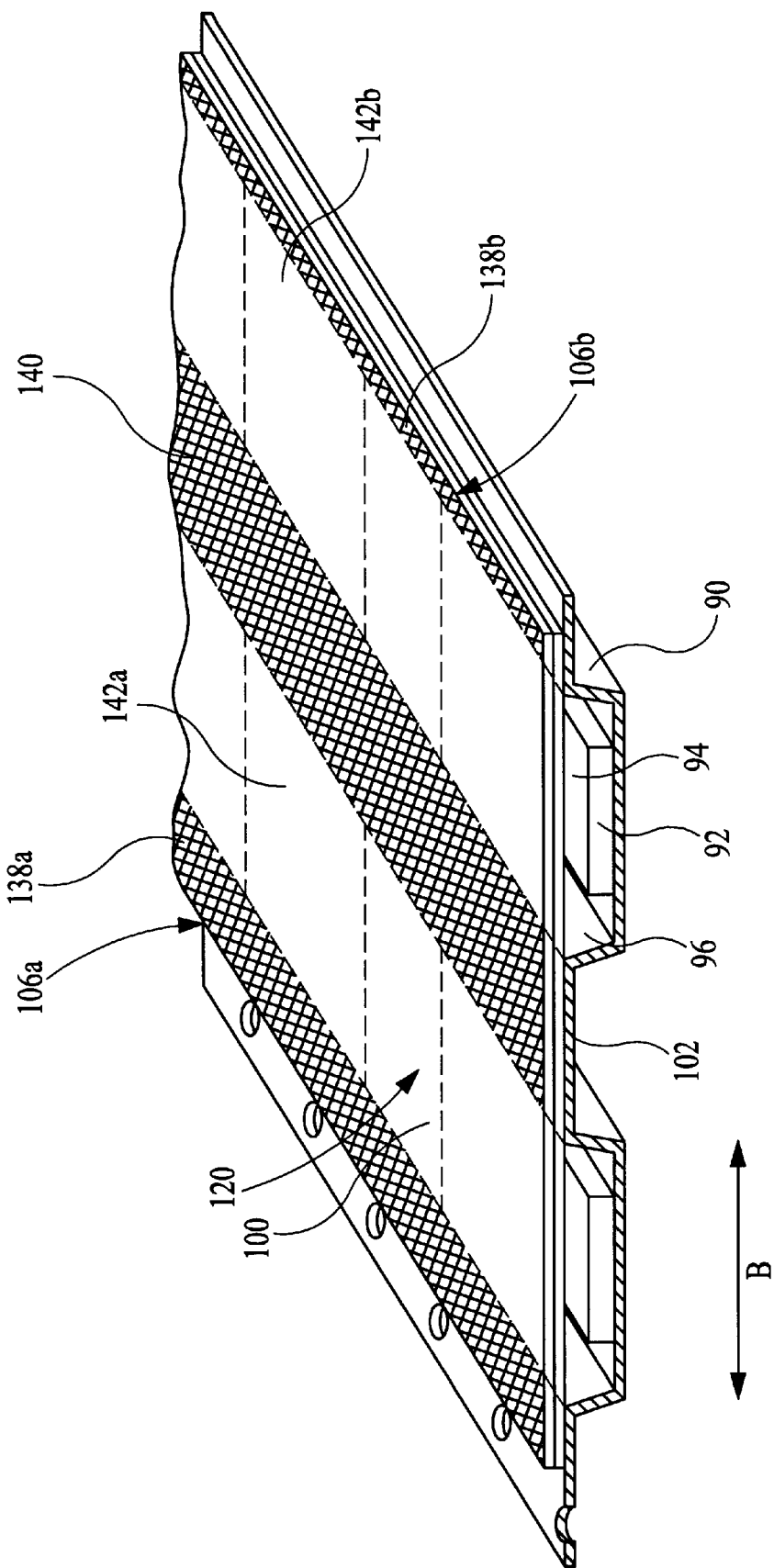
FIG. 8 is a partial cross-sectional perspective view of the third embodiment of the cover tape of the present invention in use on the carrier tape with laterally separated holding compartments.

Referring now to FIGS. 6, 7, and 8, there is shown a third embodiment of the present invention. FIG. 6 displays a second type of carrier tape 90 in which there are a plurality of laterally spaced and separated chip or item holding compartments located side by side on a single carrier tape 90. Similar to the carrier tape described before, this carrier tape 90 has a plurality of chip or item holding compartments 96 located at a submerged level beneath the surface 98 of the carrier tape 90. In each of these compartments 96, a chip or part 92 can be placed so that the top surface 94 of the chip or part remains below the top surface 98 of the carrier tape 90. A divider 100 is located between the compartments 96 and a bridge 102 is positioned between laterally separated chip or part holding compartments, such as 96a and 96b. The bridge 102 extends longitudinally the length of the carrier tape 90. This bridge 102 divides the carrier tape 90 into product columns 110a and 110b which, likewise may extend the length of the carrier tape 90. Each of these respective product columns 110a and 110b have an edge 104a and 104b respectively and an edge area 106a and 106b, respectively. One of the edge areas may have a row of apertures 108 for a delivery purpose. Each of the product columns 110a and 110b, have product or chips located in their respective holding compartments 96, and the width of these compartments is of a predetermined distance B which is larger than the chip or part to be held.

Figure 9B:
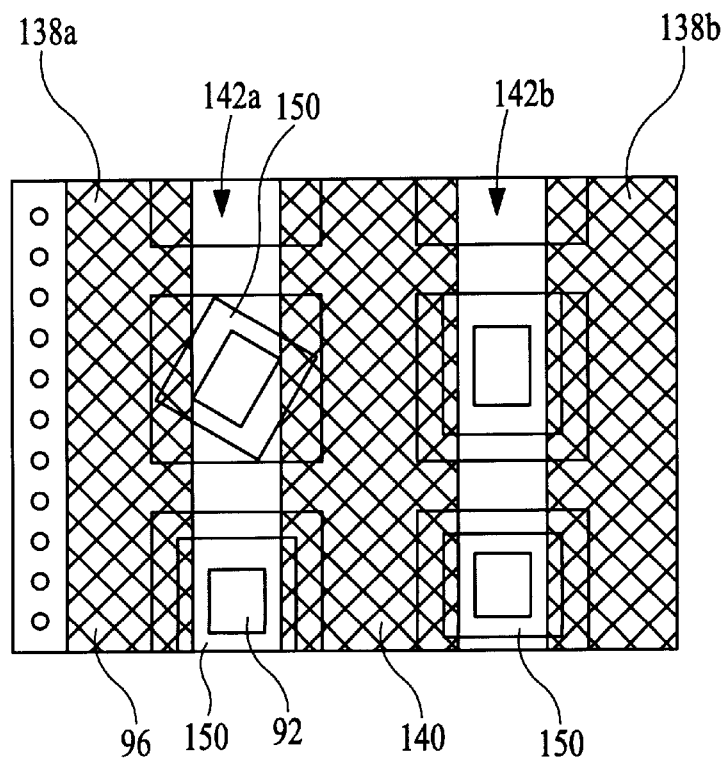

Referring now to FIG. 7, there is shown the cover tape 120 of the third embodiment of the present invention. The cover tape 120 in this embodiment includes a base film 122 with a first surface 124 and a second surface 126 having a width of Y. A primer 128 is included on the base film 122. The base film 122 has a pair of edge areas 130a and 130b which define a central area 132. Upon the second surface 126 and the base film 122, a striped or pattern coated adhesive layer 134 can be coated thereon. The stripe or pattern coated adhesive layer 134 includes a pair of edge stripes 138a and 138b and at least one bridge stripe 140. The edge stripes 138a and 138b and their respective edge areas 130a and 130b cooperate to define the central area 132, which is divided by bridge stripe 140 into a pair of product viewing areas 142a and 142b. Each of these product viewing areas 142a and 142b are defined by their respective adjacent adhesive stripes of the adhesive layer 134. For example, product viewing area 142a is defined by the distance between edge stripe 138a and bridge stripe 140. These product viewing areas 142a and 142b are preferably separated at a distance which is at least equal to or greater than the width of the carrier tape compartments 96, a distance denoted noted by the letter B, although shorter distances may be functional depending upon size, configuration, and movability of the item 92 in the carrier tape compartment 18. For example, the item 92 may be placed within a retainer mechanism 150 (See FIG. 9B) before the item 92 is placed in the carrier tape compartment 92. In this case, the adhesive stripes may be spaced closer together and extend over a portion of the compartment area where the retainer mechanism 150 is positioned without contacting or interfering with visibility of the item.

It will be appreciated by one skilled in the art that for the carrier tape 90 which is shown in FIG. 6, that a plurality of adjacent and laterally separated chip or item holding compartments can be created on one carrier tape and joined by a plurality of bridges 102. Likewise, the cover tape 120 shown in FIG. 7 can include a plurality of bridge stripes 140 and a multitude of product viewing areas 142a and 142b to correspond to the appropriate number of laterally separated chip or item holding compartments and product columns 110.

The cover tape 120 of FIG. 7 can include the anti-static layers as in the first two embodiments of the present invention. Anti-static layer 144 can be coated on the adhesive layer 134 and first surface 124 of the base film 122. The anti-static material may also be dispersed in the primer layer 128 to thereby eliminate the manufacturing step of coating the anti-static after depositing the adhesive layer onto the base film 122. An anti-static coating 136 may also be placed on the second surface 126 of the base film 122. In this manner, anti-static protection can be supplied on substantially the entire width Y of the base film 122 on both the first surface 124 and the second surface 126 of the base film 122.

Referring now to FIG. 8, there is shown the carrier tape and cover tape device of the third embodiment of the present invention. The cover tape 120 has been heat sealed or pressure sealed onto the carrier tape 90 to seal the items 92 into the compartments 96. The adhesive layer 134 of the cover tape 120 bonds with the carrier tape 90 at the respective edge areas and bridge areas of the carrier tape 90 and cover tape 120. For example, edge area of 106a of carrier tape 90 bonds with adhesive edge stripe 138a and bridge area 102 adheres to bridge stripe 140, and edge stripe 138b adheres to edge area 106b of the carrier tape 90. This enables the chip or item 92 to be sealed in its respective compartments 96 without the top surface 94 of the chip or item 92 contacting any adhesive material from the adhesive layer 134. Since there is no adhesive located over the product, this creates a clearer product viewing area 142a and 142b which enables inspection devices and persons to observe the quality, orientation, and identity of the product within the carrier tape 90 and cover tape 120 combination device. This enhanced clarity is due to the adhesive stripe or pattern printed layer having adjacent striped adhesives not located over the item 92 and preferably, located at a distance at least equal to or greater than the width B of the compartment 96 which holds the chip or item 92.

The enhanced clarity of the product viewing areas on the cover tapes of the present invention can be measured through the reflectivity of the cover tapes in each of the embodiments. A tape or film which is perfectly transparent or clear would have zero percent reflectivity (or 100% light transmission) while tapes which are more obscure or more cloudy would have higher percentages of reflectivity (or lower percentages of light transmission). A higher diffuse reflectivity of the cover tape indicates more back scattering of light from the surface of the cover tape to the light source. This higher amount of reflectivity, therefore affects machine readability on the part or chips which are contained within the holding compartments of the carrier tapes for use with the present invention.

To measure the reflectivity of the cover tape, a light source is directed onto the cover tape at a perpendicular. Any glare or reflection which comes back directly from the tape at this normal indicates a lack of total transmission of the light through the film or tape. Absorbing black cups are typically provided around the area to block out any possibility of background light sources and scattering effects.

In each of the embodiments disclosed, the striped adhesive layer, which defines the product viewing area, provides the enhanced clarity for the cover tapes. The visibility, clarity, and light transmission of the product viewing area for each of the embodiments is therefore, no worse than the visibility, clarity, and light transmission of the base film layer, or of the base film layer and the primer layer in the second embodiment. Expressed in terms of reflectivity, the product viewing area's reflectivity is at maximum value equal to the reflectivity of the base film layer, or the reflectivity of the base film layer in combination with the primer layer.

It will be appreciated by one skilled in the art that the chips or items 16 which can be placed in the holding parts and compartments 18 of the carrier tape 14 are not limited to just electronic parts, but may without intending any limitation, include small mechanical parts, food, medical devices, or pharmaceutical tablets. Further examples can include parts with integrated circuits, silicon wafers, switches, screws, fasteners, etc.

The present invention also describes a process for forming a cover tape which comprises providing a base film layer having first and second surfaces and a width. The primer layer is applied on the first surface of the base film layer with the primer layer having a central area and at least one edge area. An adhesive layer which is stripe coated or pattern coated is then applied onto at least one or both of the edge areas of the primer layer and then a first anti-static layer is applied onto the adhesive layer and onto the central area of the primer layer in order to provide an anti-static coating on substantially the entire width of the first surface of the base film. This process also allows for adhesive to preferably be located only along the edge areas of the film and not over the chip or item located in the carrier tape 14, thereby avoiding static discharge. A second anti-static layer can be coated onto the second surface of the base film layer. In a second embodiment, the primer layer may include an anti-static agent dispersed within the primer or precoated on the primer layer so that by applying the primer layer onto the first surface of the base film, the primer provides an anti-static coating on substantially the entire width of the first surface of the base film. The primer layer would have a central area and at least one edge area defined by the central area. An adhesive layer is then applied onto at least one edge area of the primer layer. The process may further comprise applying a second anti-static layer onto the second surface of the base film layer.

Figure 10:
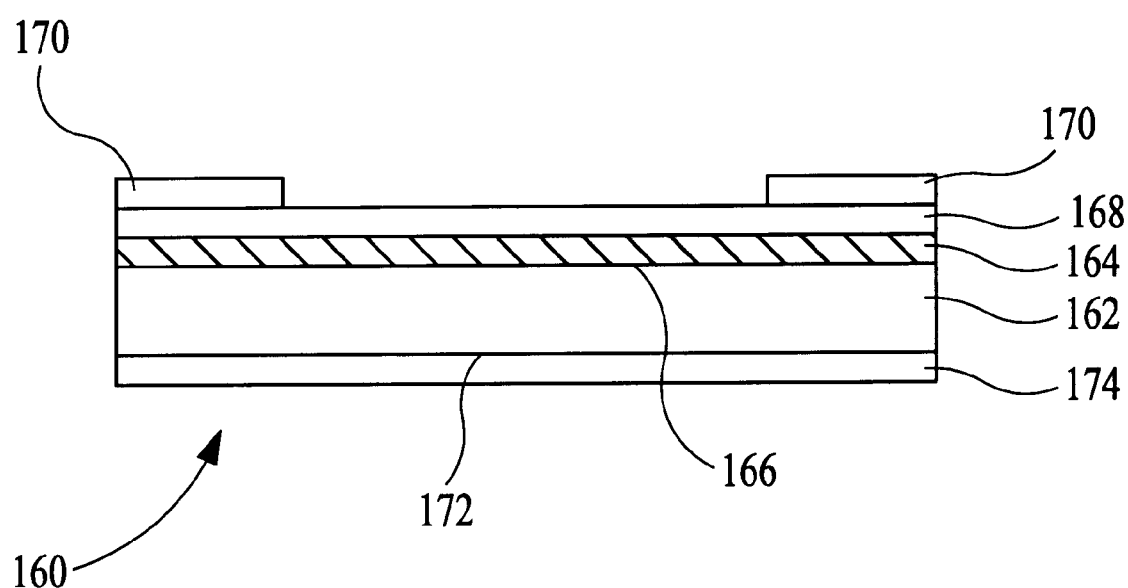
FIG. 10 is an end view of a fourth embodiment of the cover tape of the present invention.

Referring now to FIG. 10, there is shown a fourth embodiment of the present invention. This embodiment uses a metalized film layer to achieve the static decay and conductive requirements of industry standards. The cover tape 160 includes a base film layer 162, and a metalized layer 164 on the first surface 166 of the base film layer 162. A primer layer 168 may be placed on the metalized layer 164, and the adhesive stripes 170 are positioned on either the metalized layer 164 or on the primer layer 168 if that is chosen. The second surface 172 of the base film layer 162 may include an additional coating layer 174. This additional coating layer 174 can be either an antistat material or an additional metalized film layer.

In this embodiment, the metalized film layer 164 can be a metalized film or a sputter coated metal dispersement. Typically, the metalized film will be placed onto the base film layer 162 by vacuum deposition methods which are known in the art. The metalized film layer 164 includes a metallic film or metallic particles of aluminum or copper, or other suitable metals.

The materials used for the adhesive 170, the primer 168, base film 162 and any antistat on the additional film layer 174 can be of similar materials to those mentioned in the earlier embodiments. In this manner, one of the advantages of this embodiment is the elimination of the need for an antistat material on the first surface 166 of the base film 162. Additionally, the striped adhesives 170 being located on the edge areas allows for the added advantages of the earlier embodiments, which include a lack of adhesive material over the product and an improved product viewing area to other metalized films. Thus, the metalized film layer 164 provides a static discharge environment when acting in cooperation with a carrier tape. It will be recognized by one skilled in the art that the metalized film layer 164 can be used in various combinations with the embodiments earlier disclosed herein and that all such combinations of embodiments are deemed to be within the scope of the claims which are attached.

In addition to the benefits of providing a clear and more transparent central area for viewing the product chips or parts in the compartments 18 beneath the cover tape 12 and the improved anti-static properties, the other benefits include an estimated savings of adhesive material and cost, improved coating properties, and fewer defects.

The invention will now be further described by the following example, although it is not restricted thereto.

EXAMPLE 1

The film of the present invention is formed by beginning with a wide roll of film approximately one to six feet wide. A slot die forms a multiplicity of adhesive stripes from a solvent solution. The adhesive is then dried in a tunnel which blows warm air onto the film. The tunnel is over 40 feet long with stepped and controlled temperature zones. The film tension is stabilized into a series of rolls which are then wound into one long continuous roll. After the long continuous roll is made the film is again unwound and treated with an electric discharge under control tension. From this a master roll is made.

After the master roll has been completed, the rolls are sent to a slitting machine where razors are used to cut the film into individual ribbons.

In this non-limiting example, the cover tape of the present invention is formed by utilizing a 0.001 inch thick polyester base film layer, such as ICI's MELINEX® D453 or an equivalent. This polyester film has a Total Luminous Transmission of 88.8% as per ASTM D1003 and a Gardner Haze of 0.3% per ASTM D1003. The primer layer which is placed on the base film is a VAE copolymer with anti-block agent of polyethylene beads applied at 0.9–1.3 lbs. per ream.

The adhesive layer used is an SEBS or SBS block copolymer resin such as Kraton, manufactured by Shell Chemical Company or Finaprene, manufactured by FINA Oil and Chemical, with an anti-block agent of polyethylene beads applied at 12 to 14 lbs. per ream over the primer layer and striped on the edges to a width of 0.125 inches.

The antistatic layer which is applied is a quarternary ammonium salt dispersion which is applied to both sides of the tape at 0.1 lbs. per ream or until a resistivity level of $10^{10}$ ohms per square has been achieved.

Reflectivity testing was performed on a second set of MELINEX® D453 base film with no antistatic layer added to determine the reflectivity of the product viewing area. The tests were conducted on an SP 68 SpectroPhotometer, produced by X-RITE, Inc. A value of zero would indicate no non-specular light reflectance off of the film. The light source used was type F2 with 2% angle and specular reflections excluded. Tests were performed of the base film with no additional coatings or materials on the film. This gave a value of approximately 1.0% reflectivity as indicated by the measured parameter L*. Tests of film that were fully coated with adhesive material gave values of 22–25% reflectivity. These results indicate that the product viewing area of the striped adhesive film of the present invention can have a reflectance level as low as 1.0%.

What is claimed is:

1. A cover tape for sealing items in compartments of a carrier tape, said cover tape comprising:
   a base film layer having first and second surfaces, first and second edge areas, and a width,
   at least one layer of a heat sensitive adhesive formed as stripes on said first surface of said base film substantially on each of said first and second edge areas, said stripes defining therebetween in part, a viewing area having substantially the same clarity, visibility and light transmission as said base film layer, and
   a first anti-static layer formed on said heat sensitive adhesive layer and said base film layer to provide anti-static coating on substantially the entire width of said first surface of said base film.

2. The cover tape of claim 1 further comprising a second anti-static layer formed on said second surface of said base film layer.

3. The cover tape of claim 1, wherein said base film layer includes a primer layer coated on said first surface.

4. The cover tape of claim 1, wherein said striped adhesive includes a filler material disbursed in said adhesive.

5. A cover tape for sealing items in compartments of a carrier tape, said cover tape comprising:
   a base film layer having first and second surfaces, first and second edge areas, and a width,
   a primer layer coated on said first surface of said base film layer, said primer layer containing an anti-static agent to provide anti-static protection on substantially the entire width of said first surface of said base film; and at least one layer of a heat sensitive adhesive formed as stripes on said primer layer substantially on each of said first and second edge areas, said stripes defining therebetween, in part, a viewing area having substantially the same clarity, visibility and light transmission as said base film layer and said primer layer.

6. The cover tape of claim 5, further comprising, an anti-static layer formed on said second surface of said base film layer.

7. The cover tape of claim 5, wherein said base film layer includes a primer layer coated on said first surface.

8. The cover tape of claim 5, wherein said striped adhesive includes a filler material disbursed in said adhesive.

9. A process for forming a cover tape comprising, providing a base film later having first and second surfaces, first and second edge areas, and a width, applying at least one layer of a heat sensitive adhesive, formed as stripes, on said first surface of said first base film substantially on each of first and second edge areas, said stripes defining therebetween, in part, a viewing area having substantially the same clarity, visibility and light transmission as said base film layer, and forming a first anti-static layer on said striped adhesive layer and said base film layer to provide anti-static coating on substantially the entire width of said first surface of said base film.

10. The process of claim 9, further comprising applying a second anti-static layer on said second surface of said base film layer.

11. A process for forming a cover tape comprising:

providing a base film layer having first and second surfaces, first and second edge areas, and a width, coating a primer layer on said first surface of said base film layer, said primer layer containing an anti-static agent to provide anti-static protection on substantially the entire width of said first surface of said base film; and forming at least one layer of a heat sensitive adhesive formed as stripes on said primer layer substantially on each of said first and second edge areas, said stripes defining therebetween, in part, a viewing area having substantially the same clarity, visibility and light transmission as said base film layer and said primer layer.

12. The process of claim 11 further comprising, applying an anti-static layer on said second surface of said base film layer.

13. A process for forming a cover tape comprising:

providing a base film layer having first and second surfaces, first and second edge areas defining a central area, and a width, forming at least one layer of a heat sensitive adhesive layer as stripes substantially on each of said first and second edge areas, said stripes defining therebetween in part, a viewing area having substantially the same clarity, visibility and light transmission as said base film layer, and forming a first anti-static layer on said heat sensitive adhesive layer and said base film layer to provide anti-static coating on substantially the entire width of said first surface of said base film.

14. The process of claim 13 further comprising, applying an anti-static layer on said second surface of said base film layer.

15. A process for forming a cover tape comprising:

providing a base film layer having first and second surfaces, first and second edge areas defining a central area, and a width coating a primer layer on said first surface of said base film layer, said primer layer containing an anti-static agent, to provide anti-static protection on substantially the entire width of said first surface of said base film;

and forming at least one layer of a heat sensitive adhesive formed as stripes on said primer layer substantially on each of said first and second edge areas, said stripes defining therebetween, in part, a viewing area having substantially the same clarity, visibility and light transmission as said base film layer and said primer layer.

16. The process of claim 15 further comprising, applying an anti-static layer on said second surface of said base film layer.

17. A cover tape comprising:

a base film layer having a first surface, a metalized film layer on said first surface of said base film, and at least one layer of a heat sensitive adhesive formed as stripes on said metalized layer substantially on each of said first and second edge areas, said stripes defining therebetween, in part, a viewing area having substantially the same clarity, visibility and light transmission as said base film layer.

18. A cover tape for sealing items in compartments of a carrier tape, said cover tape comprising:

a base film layer having first and second surfaces, first and second edge areas, and a width, a first anti-static layer formed on said first surface of the base film and extending between the first and second edge areas to cover substantially the entire width of said first surface of said base film, at least one layer of a heat sensitive adhesive formed as stripes on said first anti-static layer substantially on each of said first and second edge areas, said stripes defining therebetween, in part, a viewing area having substantially the same clarity, visibility and light transmission as said base film layer; and a second anti-static layer formed on said at least one layer of heat sensitive adhesive.

19. The cover tape of claim 18 further comprising a third anti-static layer formed on said second surface of said base film layer.

20. The cover tape of claim 18 wherein the base film layer further includes a primer layer coated on the first surface.

21. The cover tape of claim 18 wherein the heat sensitive adhesive includes a filler material disbursed therein.

22. A process for forming a cover tape comprising:

providing a base film layer having first and second surfaces, first and second edge areas, and a width, coating a first anti-static layer formed on said first surface of the base film and extending between the first and second edge areas to cover substantially the entire width of said first surface of said base film, forming at least one layer of a heat sensitive adhesive as stripes on the first anti-static layer substantially on each of said first and second edge areas, said stripes defining therebetween, in part, a viewing area having substantially the same clarity, visibility and light transmission as said base film layer, and coating a second anti-static layer on said at least one layer of heat sensitive adhesive.

23. The process of claim 22 further comprising applying a third anti-static layer on the second surface of the base film layer.

24. The cover tape of claim 1 formed into a roll.

25. The cover tape of claim 5 formed into a roll.

26. The process of claim 9 which includes the additional step of winding the cover tape into a roll.

27. The process of claim 11 which includes the additional step of winding the cover tape into a roll.

28. The process of claim 13 which includes the additional step of winding the cover tape into a roll.

29. The process of claim 15 which includes the additional step of winding the cover tape into a roll.

30. The cover tape of claim 17 formed into a roll.

* * * * *

UNITED STATES PATENT AND TRADEMARK OFFICE
CERTIFICATE OF CORRECTION

PATENT NO. : 6,030,692
DATED : February 29, 2000
INVENTOR(S) : Auger

It is certified that error appears in the above-identified patent and that said Letters Patent is hereby corrected as shown below:

Claim 9,
Line 17, change the word "later" to -- layer --.

Signed and Sealed this

Second Day of October, 2001

Attest:

NICHOLAS P. GODICI
Attesting Officer    Acting Director of the United States Patent and Trademark Office

UNITED STATES PATENT AND TRADEMARK OFFICE
CERTIFICATE OF CORRECTION

PATENT NO.   : 6,030,692
DATED        : February 29, 2000
INVENTOR(S)  : Thomas J. Auger It is certified that error appears in the above-identified patent and that said Letters Patent is hereby corrected as shown below:

<u>Title page,</u>
Item [73], change "Netpco" to -- Neptco --.

Signed and Sealed this

Fifteenth Day of April, 2003

JAMES E. ROGAN
*Director of the United States Patent and Trademark Office*